United States Patent
Ogasawara et al.

(10) Patent No.: US 6,815,786 B2
(45) Date of Patent: Nov. 9, 2004

(54) SEMICONDUCTOR OPTICAL DEVICE AND METHOD OF MANUFACTURING THE SAME

(75) Inventors: Matsuyuki Ogasawara, Kanagawa (JP); Susumu Kondo, Tokyo (JP); Ryuzo Iga, Kanagawa (JP); Yasuhiro Kondo, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 60 days.

(21) Appl. No.: 10/222,433

(22) Filed: Aug. 16, 2002

(65) Prior Publication Data

US 2003/0042495 A1 Mar. 6, 2003

(30) Foreign Application Priority Data

Aug. 21, 2001 (JP) .......................... 2001-249831

(51) Int. Cl.[7] .......................................... H01L 31/0232
(52) U.S. Cl. .............................. 257/432; 257/2; 257/6
(58) Field of Search ......................... 257/432, 1–7, 257/E33.008, E31.033, E29.072

(56) References Cited

U.S. PATENT DOCUMENTS

2003/0209771 A1 * 11/2003 Akulova et al. ............ 257/432

FOREIGN PATENT DOCUMENTS

| JP | 01-321677 A | 12/1989 |
|----|-------------|---------|
| JP | 06-275911 A | 9/1994 |
| JP | 09-002145 A | 1/1997 |
| JP | 09-214045 A | 8/1997 |

OTHER PUBLICATIONS

Kondo, S. et al.; "Ruthenium–doped semi–insulating InP buried in InGaAlAs/InAlAs MQWs modulators", International Conference on InP and Related Materials Post Deadline Papers, pp. 19–20. May 14–18 2001.*

Matsumoto, S., et al.; "Highly reliable 1.65 μm HaInAsP laser diodes with semi–insulating iron–doped InP"; Electronics Letters; Aug. 4, 1994; pp. 1305–1306; vol. 30; No. 16.

Kondo, S., et al.; "Ruthenium–doped semi–insulating InP buried InGaAlAs/InAlAs MQWs modulators"; Post Deadline Papers; 13th IPRM; International Conference on Indium Phosphide and Related Materials; May 14–18, 2001; Cover page, Table of Contents and pp. 19–20; Nara, Japan.

(List continued on next page.)

Primary Examiner—Nathan J. Flynn
Assistant Examiner—Scott R. Wilson
(74) Attorney, Agent, or Firm—Squire, Sanders & Dempsey L.L.P.

(57) ABSTRACT

A semiconductor optical device includes, on a semiconductor substrate, a mesa-stripe-like multilayer structure constituted by at least an n-cladding layer, an active region formed from an active layer or a photoabsorption layer, and a p-cladding layer, and a buried layer in which two sides of the multilayer structured are buried using a semi-insulating semiconductor crystal. The buried layer includes a diffusion enhancement layer which is adjacent to the mesa-stripe-like multilayer structure and enhances diffusion of a p-impurity, and a diffusion suppression layer which is adjacent to the diffusion enhancement layer and suppresses diffusion of a p-impurity. A method of manufacturing a semiconductor optical device is also disclosed.

9 Claims, 6 Drawing Sheets

OTHER PUBLICATIONS van Geelen, A., et al.; "Ruthenium doped high power 1.48 µm SIPBH laser"; 11$^{th}$ International Conference on Indium Phosphide and Related Materials; May 16–20, 1999; pp. 203–206; Davos, Switzerland.

Söderström, D., et al.; "Dopant Diffusion and Current–Voltage Studies on Epitaxial InP Codoped with Ru and Fe"; Journal of Electronic Materials; accepted Apr. 6, 2001; pp. 972–976, vol. 30, No. 8.

Wakita, K., et al.; "Very–High–Allowability of Incidental Optical Power for Polarization–Insensitive InGaAs/InAlAs Multiple Quantum Well Modulators Buried in Semi–Insulating InP"; Jpn. J. Appl. Phys.; Mar. 1998; pp. 1432–1435; vol. 37, Part 1, No. 3B.

Söderström, D., et al.; "Electrical Characterization of Ruthenium–Doped InP Grown by Low Pressure Hydride Vapor Phase Epitaxy"; Electrochemical and Solid–State Letters, 2001; pp. G53–G55; vol. 4 (6).

Söderström, D., et al.; "Studies on Ruthenium–Doped InP Growth by Low–Pressure Hydride Vapor–Phase Epitaxy"; Journal of The Electrochemical Society: 2001; pp. G375–G378, vol. 148 (7).

Young, E. W. A., et al.; "Zinc–stimulated outdiffusion of iron in InP"; Appl. Phys. Lett.; Jan. 8, 1990; pp. 146–147; vol. 56 (2).

Dadgar, A., et al.; "Growth of Ru doped semi–insulating InP by low pressure metalorganic chemical vapor deposition"; Journal of Crystal Growth, 1998; pp. 69–73; vol. 195.

Takeuchi, Tatsuya, et al.; "Substrate Orientation Dependence of Fe Doping in MOVPE–Grown InP"; Extended Abstracts of the 1993 International Conference on Solid State Devices and Materials; 1993; pp. 285–287.

Dadgar, A., et al.; "Ruthenium: A superior compensator of InP"; Applied Physics Letters; Dec. 28, 1998; pp. 3876–3880; vol. 73, No. 26.

* cited by examiner

SEMICONDUCTOR OPTICAL DEVICE AND METHOD OF MANUFACTURING THE SAME

BACKGROUND OF THE INVENTION

The present invention relates to semiconductor optical devices and a method of manufacturing them and, more particularly, to a semiconductor optical device having two sides of an active region buried in a semi-insulating crystal and a method of manufacturing the device.

A semi-insulating buried heterostructure (SIBH) having a semi-insulating layer as a buried layer is used for a semiconductor optical device such as a semiconductor laser diode or semiconductor optical modulator. It is known that when this structure is used for such a device, lower device capacitance and higher speed modulation can be realized than when a p-n buried structure is used. For this reason, a semi-insulating buried heterostructure is indispensable to semiconductor optical modulators and semiconductor optical devices used for a high capacity optical transmission system.

When such a semi-insulating buried heterostructure is used, many defects originating from damage due to a mesa process and an impurity used in a regrowth process exist in a regrowth interface in a burying growth process. This produces a leakage current when the device operates. In a semiconductor laser diode, this causes an increase in threshold current, a decrease in optical output efficiency, a deterioration in temperature characteristics, and the like.

In addition, a semiconductor crystal doped with iron (Fe) is conventionally used for such a semi-insulating buried heterostructure. If, however, iron (Fe) is used as a dopant, interdiffusion of iron (Fe) as a dopant for a semi-insulating buried layer and zinc (Zn) as a dopant for a p-cladding layer and p-contact layer of the device occurs at the interface between the semi-insulating buried layer and the device. As a consequence, as zinc is diffused into the buried layer, the characteristics of the device deteriorate, resulting in a deterioration in modulation characteristics.

In addition, Zn moved to the interstitial position between lattices by the above interdiffusion is also diffused into the active layer having an interface with the buried layer, resulting in a decrease in the optical output efficiency of the active layer.

It is known that the above interdiffusion is not limited to the case wherein Zn is used as a p-impurity, and other p-impurities such as Be, Cd, and Mg also cause interdiffusion with Fe.

As shown in FIG. 5, a technique of solving such a problem by inserting an Fe diffusion preventing layer 36 between a mesa stripe (MS) and an Fe-doped InP buried layer 37 is disclosed (Japanese Patent Laid-Open No. 9-214045). Referring to FIG. 11, reference numeral 31 denotes a semiconductor substrate; 32, a buffer layer; 33, an active layer; 34, a cladding layer; 35, a contact layer; and 36, an Fe diffusion preventing layer.

Recently, it has been found that in a semi-insulating semiconductor crystal doped with ruthenium (symbol of element: Ru), almost no interdiffusion occurs between Ru and Zn.

As shown in FIG. 6, the manufacture of a semiconductor laser using Ru-doped semi-insulating buried layers has been reported ("A. Dadger et.al, Applied Physics Letters Vol. 73, No. 26 pp. 3878–3880 (1998)", "A. Van Geelen et. at., 11th International Conference on Indium Phosphide and Related materials TuB 1–2 (1999)").

SUMMARY OF THE INVENTION

It is an object of the present invention to provide a semiconductor optical device which has a structure that can control diffusion of an impurity contained in a layer constituting a mesa stripe into a semi-insulating buried layer formed on two sides of the mesa stripe, and a method of manufacturing the device.

In order to achieve the above object, the present inventor has found that impurity diffusion into a buried layer can be controlled if a semi-insulating buried layer arranged on two sides of a layer forming a mesa stripe including an n-cladding layer, active region, and p-cladding layer is constituted by a diffusion enhancement layer which is adjacent to the mesa-stripe-like multilayer structure and enhances diffusion of a p-impurity, and a diffusion suppression layer which is adjacent to the diffusion enhancement layer and contains a semi-insulating impurity that suppresses diffusion of the p-impurity.

According to an aspect of the present invention, there is provided a semiconductor optical device comprising, on a semiconductor substrate, a mesa-stripe-like multilayer structure constituted by at least an n-cladding layer, an active region formed from an active layer or a photoabsorption layer, and a p-cladding layer, and a buried layer in which two sides of the multilayer structured are buried using a semi-insulating semiconductor crystal, the buried layer including a diffusion enhancement layer which is adjacent to the mesa-stripe-like multilayer structure and enhances diffusion of a p-impurity, and a diffusion suppression layer which is adjacent to the diffusion enhancement layer and suppresses diffusion of a p-impurity.

According to another aspect of the present invention, there is provided a semiconductor optical device comprising a semiconductor laser including, on a semiconductor substrate, a mesa-stripe-like multilayer structure constituted by at least an n-cladding layer, an active region formed from an active layer, and a p-cladding layer, and a buried layer in which two sides of the multilayer structured are buried using a semi-insulating semiconductor crystal, the buried layer including a diffusion enhancement layer which is adjacent to the mesa-stripe-like multilayer structure and enhances diffusion of a p-impurity, and a diffusion suppression layer which is adjacent to the diffusion enhancement layer and suppresses diffusion of a p-impurity, and an electroabsorption optical modulator including, on a semiconductor substrate, a mesa-stripe-like multilayer structure constituted by at least an n-cladding layer, an active region formed from a photoabsorption layer, and a p-cladding layer, and a buried layer in which two sides of the multilayer structured are buried using a semi-insulating semiconductor crystal, the buried layer including a diffusion enhancement layer which is adjacent to the mesa-stripe-like multilayer structure and enhances diffusion of a p-impurity, and a diffusion suppression layer which is adjacent to the diffusion enhancement layer and suppresses diffusion of a p-impurity, wherein a monolithically integrated light source including the semiconductor laser and the electroabsorption optical modulator is formed.

According to still another aspect of the present invention, there is provided a method of manufacturing a semiconductor optical device, comprising the step of forming, on a semiconductor substrate, a mesa-stripe-like multilayer structure constituted by at least an n-cladding layer, an active region formed from an active layer or a photoabsorption layer, and a p-cladding layer, the step of processing the multilayer structure into a mesa stripe, and the step of forming a buried layer by burying two sides of the multilayer structured in a semi-insulating semiconductor crystal, the step of forming the buried layer including the step of forming a diffusion enhancement layer which is adjacent to the mesa-stripe-like multilayer structure and enhances diffusion of a p-impurity, and the step of forming a diffusion suppression layer which is adjacent to the diffusion enhancement layer and suppresses diffusion of a p-impurity.

According to still another aspect of the present invention, there is provided a method of manufacturing a semiconductor optical device constituting monolithically integrated semiconductor laser and optical modulator on a semiconductor substrate, the step of forming the semiconductor optical device including the step of forming, on a semiconductor substrate, a mesa-stripe-like multilayer structure constituted by at least an n-cladding layer, an active region formed from optically coupled active layer and photoabsorption layer, and a p-cladding layer, and the step of forming a buried layer in which two sides of the multilayer structured are buried using a semi-insulating semiconductor crystal, the step of forming the buried layer including the step of forming a diffusion enhancement layer which is adjacent to the mesa-stripe-like multilayer structure and enhances diffusion of a p-impurity, and the step of forming a diffusion suppression layer which is adjacent to the diffusion enhancement layer and suppresses diffusion of a p-impurity.

DESCRIPTION OF THE PREFERRED EMBODIMENTS

A semiconductor optical device according to the present invention will be described in detail below by using the embodiments.

[First Embodiment]

Figure 1:
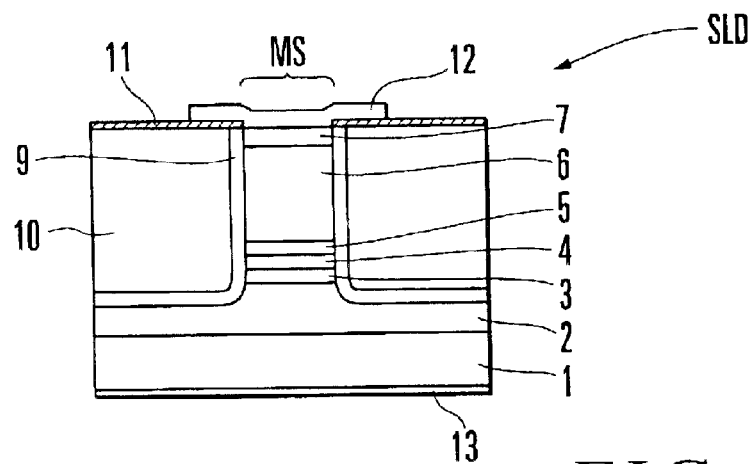
FIG. 1 is a view showing the structure of the first and second embodiments of the present invention.

FIG. 1 shows a case wherein a semiconductor optical device according to the present invention is applied to a semiconductor laser having an MQW (multiple quantum well) active layer.

Referring to FIG. 1, a 0.2 $\mu$m-thick Se-doped n-InP cladding layer 2 is formed on a (100) oriented n-InP substrate 1. In addition, a 40 nm-thick undoped InGaAsP guide layer 3 having a bandgap wavelength of 1.3 $\mu$m, a 0.15 $\mu$m-thick strained undoped InGaAsP/InGaAsP MQW (multiple quantum well) active layer 4 having a lasing wavelength of 1.55 $\mu$m, a 40 nm-thick undoped InGaAsP guide layer 5 having a bandgap wavelength of 1.3 $\mu$m, a 1.5 $\mu$m-thick Zn-doped p-InP cladding layer 6, and a 0.3 $\mu$m-thick Zn-doped InGaAs contact layer 7 are successively stacked on the surface of the Se-doped n-InP cladding layer 2 (part of the surface of the cladding layer 2 in this case) in the order named.

In this case, alloy semiconductor layers other than the active layer 4 have compositions lattice-matched to the InP substrate 1 unless otherwise specified.

This multilayer structure is processed into a mesa stripe MS having a width of about 2 $\mu$m and a height of about 3 $\mu$m. In addition, two sides of the mesa stripe MS are buried in buried layers characterized by the present invention, i.e., Fe-doped InP layers 9 serving as diffusion enhancement layers placed adjacent to the mesa stripe and Ru-doped InP layers 10 serving as diffusion suppression layers placed adjacent to the InP layers 9.

The Fe-doped InP layer 9 is located between a side wall of the mesa stripe MS and the Ru-doped InP layer 10 and between the surface of the Se-doped n-InP cladding layer 2 and the Ru-doped InP layer 10. The thickness of the Fe-doped InP layer 9 can be changed as needed. In addition, it suffices if the Fe-doped InP layer 9 is doped with Fe in an amount large enough to induce Zn diffusion.

The amount of Ru added to the Ru-doped InP layer 10 should be large enough to sufficiently make this layer semi-insulating.

In the Fe-doped InP layer 9 using as a diffusion enhancement layer, Zn is diffused from the Zn-doped p-InP cladding layer 6 with which the Fe-doped InP layer 9 is in contact, in a burying growth process. As a consequence, the conductivity type changes to the p-type. For this reason, defects in the interface between the Zn-doped p-InP cladding layer 6 and the Fe-doped InP layer 9 decrease, thus reducing leakage current.

However, since Zn is not easily diffused into the Ru-doped InP layer 10, Zn diffusion is limited up to the Fe-doped InP layer 9. It suffices if the Fe-doped InP layer 9 is formed at least between a side wall of the mesa stripe MS and the Ru-doped InP layer 10. The Fe-doped InP layer 9 is not always required between the surface of the Se-doped n-InP cladding layer 2 and the Ru-doped InP layer 10.

An SiO$_2$ passivation film 11 is formed on the entire surface except for the surface portion immediately above the mesa stripe MS. A p-electrode 12 is formed on the surface of the InGaAs contact layer 7 immediately above the mesa stripe MS. An n-electrode 13 is further formed on the bottom surface of the n-InP substrate 1.

A difference between this device and a conventional buried semiconductor optical device will be described below.

The device according to the present invention differs from the conventional device in that the Fe-doped InP layer 9 using as a diffusion enhancement layer is inserted between a side wall of the mesa stripe MS and the Ru-doped InP layer 10.

With this structure, in the Fe-doped InP layer 9, Zn is diffused from the Zn-doped p-InP cladding layer 6 with which the Fe-doped InP layer 9 is in contact, in a burying growth process. As a consequence, the conductivity type of the Fe-doped InP layer 9 changes to the p-type. For this reason, defects in the interface between the Zn-doped p-InP cladding layer 6 and the Fe-doped InP layer 9 decrease, thus reducing leakage current. With this structure, since Zn is not easily diffused from the Zn-doped p-InP cladding layer 6 into the Ru-doped InP layer 10, Zn diffusion is limited up to the Fe-doped InP layer 9.

As described above, since Zn diffusion from the Zn-doped p-InP cladding layer 6 is limited to only the Fe-doped InP layer 9, an unnecessary increase in device capacitance can be avoided, and high speed modulation can be done.

The effects of this embodiment will be described in detail next.

Three types of devices were manufactured such that the Fe-doped InP layers 9 have thicknesses (a) 0.1 μm, (b) 0.4 μm, and (c) 0.8 μm, respectively, and their characteristics were compared. In this case, the thickness of the Fe-doped InP layer 9 means the thickness of a side of the mesa stripe MS.

The resistivities of the buried layers of the three types of devices were about $10^8$ Ωcm or more. It was found that the formed buried layers had sufficiently high resistances.

The small signal modulation characteristics of semiconductor lasers respectively formed into chips were, at a 3 dB bandwidth, (a) about 8 GHz when the thickness of the Fe-doped InP layer 9 was 0.8 μm, (b) about 15 GHz when the thickness was 0.4 μm, and (c) about 15 GHz when the thickness was 0.1 μm.

The threshold current and optical output efficiency remained constant regardless of the thickness of the Fe-doped InP layer and were about 10 mA and about 35%, respectively. That is, the device characteristics were good except that the device capacitance changed depending on the thickness of the Fe-doped InP layer.

That is, since the diffusion length of Zn is limited by the thickness of the Fe-doped InP layer 9 using as a diffusion enhancement layer, the device capacitance decreases as the thickness of the Fe-doped InP layer 9 decreases.

The existence of the Fe-doped InP layer 9 using as a diffusion enhancement layer enhances Zn diffusion to decrease defects in the interface between the Zn-doped p-InP cladding layer 6 and the Fe-doped InP layer 9 and reduce leak current, thereby obtaining a semiconductor laser having a low threshold current and high optical output efficiency.

Figure 2A:
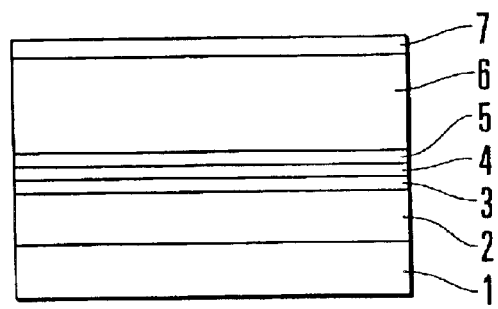
FIGS. 2A to 2C are views showing the steps in manufacturing methods according to the first and second embodiments of the present invention.
Figure 2B:
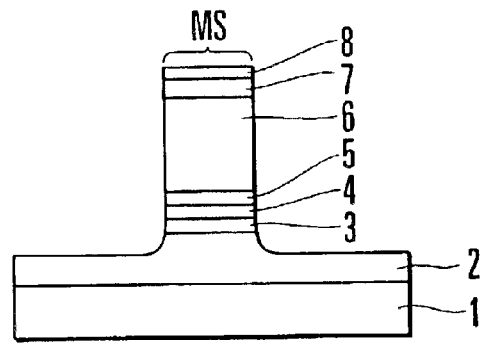
Figure 2C:
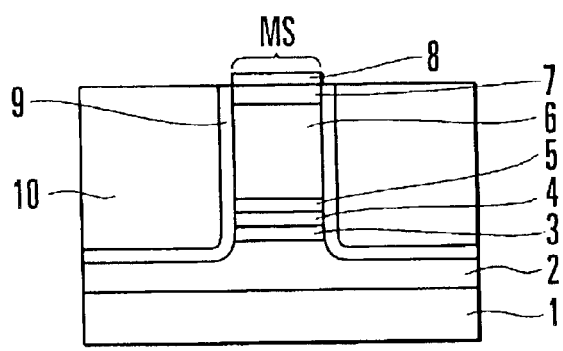

A method of manufacturing a semiconductor laser according to this embodiment will be descried with reference to FIGS. 2A to 2C.

First of all, as shown in FIG. 2A, the 0.2 μm-thick Se-doped n-InP cladding layer 2, the 40 nm-thick undoped InGaAsP guide layer 3 having a bandgap wavelength of 1.3 μm, the 0.15 μm-thick strained undoped InGaAsP/InGaAsP MQW (multiple quantum well) active layer 4 having a lasing wavelength of 1.55 μm, the 40 nm-thick undoped InGaAsP guide layer 5 having a bandgap wavelength of 1.3 μm, the 1.5 μm-thick Zn-doped p-InP cladding layer 6, and the 0.3 μm-thick Zn-doped InGaAs contact layer 7 were successively stacked on the (100) oriented n-InP substrate 1.

In this case, alloy semiconductors other than the active layer have compositions lattice-matched to the InP substrate 1 unless otherwise specified.

As shown in FIG. 2B, the mesa stripe MS having a width of about 2 μm and a height of about 3 μm was formed by RIE (reactive ion etching) using an $SiO_2$ film 8 as a mask.

As shown in FIG. 2C, the Fe-doped InP layer 9 using as a diffusion enhancement layer and the Ru-doped InP layer 10 (thickness: 3 μm) using as a diffusion suppression layer were grown, by the MOVPE method, on the substrate on which the mesa stripe MS was formed.

The Fe-doped InP layer 9 was grown by using known dicyclopentadienyliron (Cp2Fe) as an Fe source. In addition, layer thickness was controlled by the growth time.

The Ru-doped InP layer 10 using as a diffusion suppression layer was grown by using bis(η 5-2, 4-dimethylpentadienyl)ruthenium(II) was used as an Ru source.

Subsequently, the $SiO_2$ mask 8 was removed, and the $SiO_2$ passivation film 11 was formed on the entire surface of the resultant structure except for a surface portion immediately above the mesa stripe MS. The p-electrode 12 was then formed, and the n-electrode 13 was formed on the bottom surface of the substrate 1, thereby completing the device shown in FIG. 1.

Fe doping concentrations in the Fe-doped InP layers 9 using as diffusion enhancement layers will be described below.

Three types of devices were manufactured by setting the thicknesses of the Fe-doped InP layers 9 to 0.4 μm and the Fe doping concentrations to (a) $0.3 \times 10^{17}$ cm$^{-3}$, (b) $0.7 \times 10^{17}$ cm$^{-3}$, and (c) $1.0 \times 10^{17}$ cm$^{-3}$.

The characteristics of these devices were then compared.

In this case, the Fe doping concentration means the concentration of Fe, of Fe atoms added into the semiconductor crystal, which were activated as electron compensators.

The threshold current was (a) 20 mA when the Fe doping concentration was $0.3 \times 10^{17}$ cm$^{-3}$, (b) 10 mA when the Fe doping concentration was $0.7 \times 10^{17}$ cm$^{-3}$, and (c) 10 mA when the Fe doping concentration was $1.0 \times 10^{17}$ cm$^{-3}$.

That is, when the Fe doping concentration was $0.3 \times 10^{17}$ cm$^{-3}$, Zn was not sufficiently diffused into the Fe-doped InP layer 9, and hence defects in the interface between the Zn-doped p-InP cladding layer 6 and the Fe-doped InP layer 9 did not satisfactorily decrease. This increased leak current and threshold current.

When the Fe doping concentration was $0.7 \times 10^{17}$ cm$^{-3}$ or more, Zn was sufficiently diffused into the Fe-doped InP layer 9, and hence the defects in the interface between the Zn-doped p-InP cladding layer 6 and the Fe-doped InP layer 9 satisfactorily decreased. This decreased the leak current and threshold current.

[Second Embodiment]

This embodiment is related to an electroabsorption modulator (EA modulator) using InGaAsP/InGaAsP multiple quantum wells for a photoabsorption layer. The structure of this device is almost the same as that of the first embodiment, and hence will be described with reference to FIGS. 1 and 2A to 2C.

First of all, as shown in FIG. 2A, a 0.2 μm-thick Se-doped n-InP cladding layer 2, a 40 nm-thick undoped InGaAsP guide layer 3 having a bandgap wavelength of 1.3 μm, a 0.15 μm-thick strained undoped InGaAsP/InGaAsP MQW (multiple quantum well) active layer 4 having a lasing wavelength of 1.50 μm, a 40 nm-thick undoped InGaAsP guide layer 5 having a bandgap wavelength of 1.3 μm, the 1.5 μm-thick Zn-doped p-InP cladding layer 6, and a 0.3 μm-thick Zn-doped p-InGaAs contact layer 7 were successively stacked on a (100) oriented n-InP substrate 1.

In this case, alloy semiconductor layers other than the photoabsorption layer have compositions lattice-matched to the InP substrate 1 unless otherwise specified.

As shown in FIG. 2B, a mesa stripe MS having a width of about 2 μm and a height of about 3 μm was formed by RIE (reactive ion etching) using an $SiO_2$ film 8 as a mask.

As shown in FIG. 2C, an Fe-doped InP layer 9 using as a diffusion enhancement layer and an Ru-doped InP layer 10 (thickness: 3 μm) using as a diffusion suppression layer were grown, by the MOVPE method, on the substrate on which the mesa stripe MS was formed.

The Fe-doped InP layer 9 was grown by using a known material. In addition, bis(η 5-2, 4-dimethylpentadienyl) ruthenium(II) was used as an Ru source.

Subsequently, the SiO$_2$ mask 8 was removed, and an SiO$_2$ passivation film 11 was formed on the entire surface of the resultant structure except for a surface portion immediately above the mesa stripe MS. A p-electrode 12 was then formed, and an n-electrode 13 was formed on the substrate side, thereby completing the device shown in FIG. 1.

Three types of devices were manufactured such that the Fe-doped InP layers 9 have thicknesses (a) 0.1 μm, (b) 0.4 μm, and (c) 0.8 μm, respectively, and their characteristics were compared. In this case, the thickness of the Fe-doped InP layer 9 means the thickness of a side of the mesa stripe MS.

The resistivity of the overall buried layer of each of the three types of devices was about $10^8$ Ωcm or more.

The small signal modulation characteristics of semiconductor lasers respectively formed into chips were, at a 3 dB bandwidth, (a) about 10 GHz when the thickness of the Fe-doped InP layer 9 was 0.8 μm, (b) about 15 GHz when the thickness was 0.4 μm, and (c) about 20 GHz when the thickness was 0.1 μm.

This indicates that the device capacitance decreased with a reduction in the thickness of the Fe-doped InP layer 9, and the modulation bandwidth increased.

The comparison between extinction ratios of these devices reveals that the extinction ratio tends to decrease as the thickness of the Fe-doped InP layer 9 increases. This is because when Zn is diffused into the Fe-doped InP layer 9, Fe is diffused from the Fe-doped InP layer 9 to the p-InP cladding layer 6 due to Zn—Fe interdiffusion. The diffused Fe moves Zn to the interstitial position between lattices by the kick-out mechanism. The Zn moved to the interstitial position is diffused into the photoabsorption layer. Since the amount of Fe diffused into the p-InP cladding layer by interdiffusion increases with an increase in the thickness of the Fe-doped InP layer, the amount of Zn diffused into the photoabsorption layer increases. For this reason, the electric field applied to the photoabsorption layer decreases, resulting in a decrease in extinction ratio.

[Third Embodiment]

The third embodiment of the present invention will be described below with reference to FIG. 3.

This embodiment will exemplify an integrated light source formed by monolithically integrating an electroabsorption optical modulator (EAM) and distributed feedback laser (DFB-LD).

Figure 3:
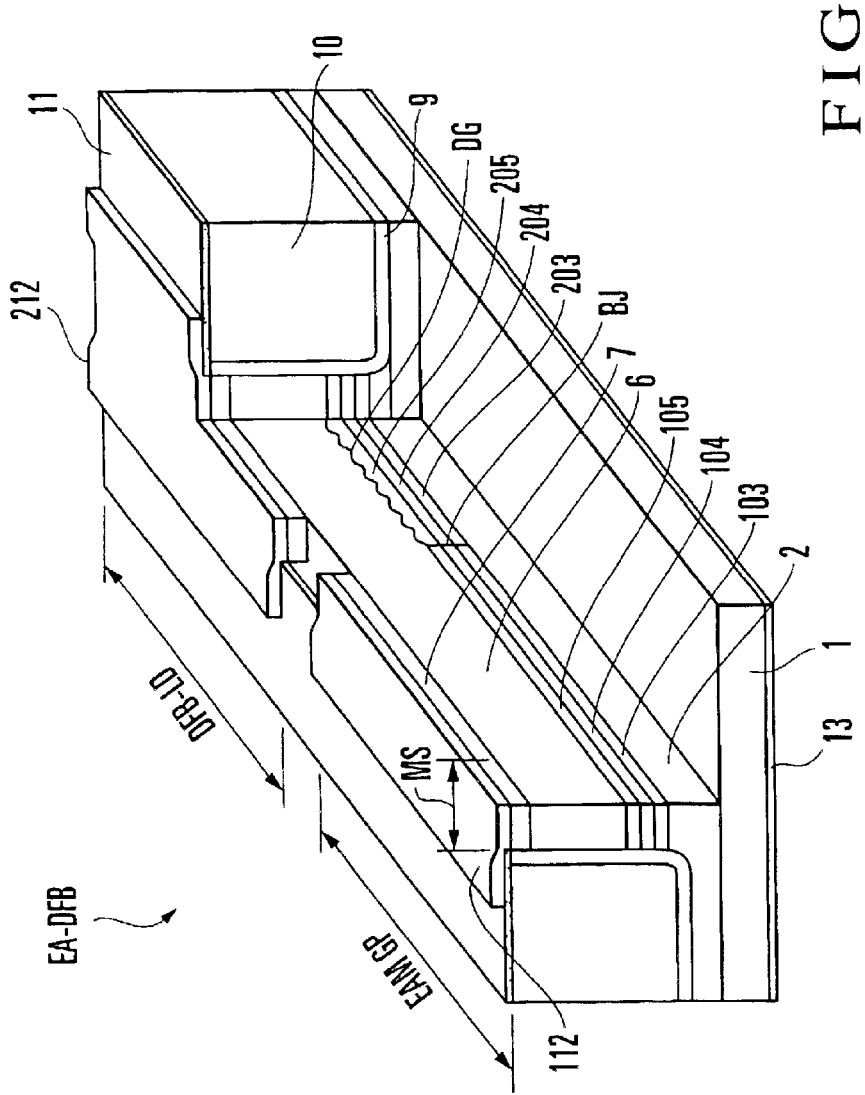
FIG. 3 is a view showing the structure of the third embodiment of the present invention.

Referring to FIG. 3, this light source is constituted by the electroabsorption optical modulator (EAM), the distributed feedback laser (DFB-LD), and a groove portion (GP) formed between them. The respective components are formed on a (100) oriented n-InP substrate 1 as a common substrate.

In the arrangement of the electroabsorption optical modulator (EAM), a 0.2 μm-thick Se-doped n-InP cladding layer 2, a 40 nm-thick undoped InGaAsP guide layer 103 having a bandgap wavelength of 1.3 μm, a 0.15 μm-thick strained undoped InGaAsP/InGaAsP MQW (multiple quantum well) active layer 104 having a lasing wavelength of 1.50 μm, a 40 nm-thick undoped InGaAsP guide layer 105 having a bandgap wavelength of 1.3 μm, the 1.5 μm-thick Zn-doped p-InP cladding layer 106, and a 0.3 μm-thick Zn-doped InGaAs contact layer 107 are successively stacked on the (100) oriented n-InP substrate 1.

In this case, alloy semiconductor layers other than the photoabsorption layer have compositions lattice-matched to the InP substrate 1 unless otherwise specified.

The above multilayer structure is formed into a mesa stripe MS having a width of about 2 μm and a height of about 3 μm. Two side surfaces of the mesa stripe MS are buried in an Fe-doped InP layer 9 and Ru-doped InP layer 10.

In the Fe-doped InP layer 9 using as a diffusion enhancement layer, Zn is diffused from a Zn-doped p-InP cladding layer 6 with which the Fe-doped InP layer 9 is in contact, in a burying growth process. As a consequence, the conductivity type changes to the p-type. For this reason, defects in the interface between the Zn-doped p-InP cladding layer 6 and the Fe-doped InP layer 9 decrease, thus reducing leakage current.

However, since Zn is not easily diffused into the Ru-doped InP layer 10, Zn diffusion is limited up to the Fe-doped InP layer 9.

An SiO$_2$ passivation film 11 is formed on the entire surface except for the surface portion immediately above the mesa stripe MS. A p-electrode 112 is formed on the resultant structure. A common n-electrode 13 is further formed on the substrate side.

In the arrangement of the distributed feedback laser (DFB-LD), the 0.2 μm-thick Se-doped n-InP cladding layer 2, a 40 nm-thick undoped InGaAsP guide layer 203 having a bandgap wavelength of 1.3 μm, a 0.15 μm-thick strained undoped InGaAsP/InGaAsP MQW (multiple quantum well) active layer 204 having a lasing wavelength of 1.55 μm, a 40 nm-thick undoped InGaAsP guide layer 205 having a bandgap wavelength of 1.3 μm and a diffraction grating formed on its upper surface, the 1.5 μm-thick Zn-doped p-InP cladding layer 6, and a 0.3 μm-thick Zn-doped InGaAs contact layer 7 are successively stacked on the n-InP substrate 1.

In this case, alloy semiconductor layers other than the active layer have compositions lattice-matched to the InP substrate 1 unless otherwise specified.

The above multilayer structure is formed into a mesa stripe MS having a width of about 2 μm and a height of about 3 μm. Two side surfaces of the mesa stripe MS are buried in the Fe-doped InP layer 9 using as a diffusion enhancement layer and the Ru-doped InP layer 10 using as a diffusion suppression layer.

In the Fe-doped InP layer 9 using as a diffusion enhancement layer, Zn is diffused from the Zn-doped p-InP cladding layer 6 with which the Fe-doped InP layer 9 is in contact, in a burying growth process. As a consequence, the conductivity type changes to the p-type. For this reason, defects in the interface between the Zn-doped p-InP cladding layer 6 and the Fe-doped InP layer 9 decrease, thus reducing leakage current.

However, since Zn is not easily diffused into the Ru-doped InP layer 10 using as a diffusion suppression layer, Zn diffusion is limited up to the Fe-doped InP layer 9.

The SiO$_2$ passivation film 11 is formed on the entire surface except for the surface portion immediately above the mesa stripe MS. A p-electrode 212 is formed on the resultant structure. The common n-electrode 13 is further formed on the substrate side.

In the groove portion GP, the photoabsorption layer 104 and active layer 204 are optically coupled to each other with a butt-joint configuration. In order to ensure electric insulation, the InGaAs contact layer 7 is removed.

The mesa stripe structure and the buried layers, i.e., the Fe-doped InP layer 9 and Ru-doped InP layer 10, are common to the electroabsorption optical modulator portion, distributed feedback semiconductor laser portion, and groove portion.

The Fe-doped InP layer 9 and Ru-doped InP layer 10 which are buried layers are formed at once.

The comparison between the electroabsorption optical modulator (EAM) and distributed feedback laser (DFB-LD)

reveals contradictory required conditions concerning a semi-insulating burying process.

In the distributed feedback laser (DFB-LD), in order to eliminate leakage current, it is necessary to decrease defects in the regrowth interface by enhancing Zn diffusion from the Zn-doped p-InP cladding layer 6.

In the electroabsorption optical modulator (EAM), however, high speed modulation cannot be done if the device capacitance increases due to Zn diffusion.

In order to meet such contradictory requirements, the thickness of the Fe-doped InP layer 9 using as a buried layer must be optimized.

Three types of devices were manufactured such that the Fe-doped InP layers 9 have thicknesses (a) 0.1 μm, (b) 0.4 μm, and (c) 0.8 μm, respectively, and their characteristics were compared. In this case, the thickness of the Fe-doped InP layer means the thickness of a side of the mesa stripe MS.

The resistivities of the electroabsorption optical modulator portions and distributed feedback laser portions in the buried layers of the three types of devices were about $10^8$ Ωcm or more.

The threshold currents and optical output efficiencies of the distributed feedback laser portions (DFB-LDs) formed into chips remained constant regardless of the thicknesses of the Fe-doped InP layers 9 and were about 10 mA and about 35%, respectively. These values were obtained when the reverse biases applied to the electroabsorption optical modulator portions (EAMs) were set to zero.

The distributed feedback laser portions (DFB-LDs) were lased under constant injection current, and the resultant lasing light intensity was modulated by the electroabsorption optical modulator portions (EAMs). The resultant characteristics were compared with each other.

The small signal modulation characteristics of the electroabsorption optical modulators (EAMs) were, at a 3 dB bandwidth, (a) about 10 GHz when the thickness of the Fe-doped InP layer 9 was 0.8 μm, (b) about 15 GHz when the thickness was 0.4 μm, and (c) about 20 GHz when the thickness was 0.1 μm. This indicates that the device capacitance decreased with a reduction in the thickness of the Fe-doped InP layer, and the modulation bandwidth increased.

The comparison between extinction ratios of these devices reveals that the extinction ratio tends to decrease as the thickness of the Fe-doped InP layer 9 increases. This is because when Zn is diffused into the Fe-doped InP layer 9, Fe is diffused from the Fe-doped InP layer 9 to the p-InP cladding layer 6 by Zn—Fe interdiffusion. The diffused Fe moves Zn to the interstitial position between lattices by the kick-out mechanism. The Zn moved to the interstitial position is diffused into the photoabsorption layer.

Since the amount of Fe diffused into the p-InP cladding layer 6 by interdiffusion increases with an increase in the thickness of the Fe-doped InP layer 9, the amount of Zn diffused into the photoabsorption layer increases. For this reason, the electric field applied to the photoabsorption layer decreases, resulting in a decrease in extinction ratio.

When the thickness of the Fe-doped InP layer 9 is 0.1 μm, the threshold current of the distributed feedback laser portion (DFB-LD) is low, and the optical output efficiency is high. In addition, the modulation bandwidth of the electroabsorption optical modulator portion (EAM) is wide.

By inserting the Fe-doped InP layer 9 serving as a diffusion enhancement layer between a side wall of the mesa stripe MS and the Ru-doped InP layer 10 in this manner, an integrated light source that meets the contradictory required conditions concerning a semi-insulating burying process.

A method of manufacturing a semiconductor optical device according to this embodiment will be described with reference to FIGS. 4A to 4G.

Figure 4A:
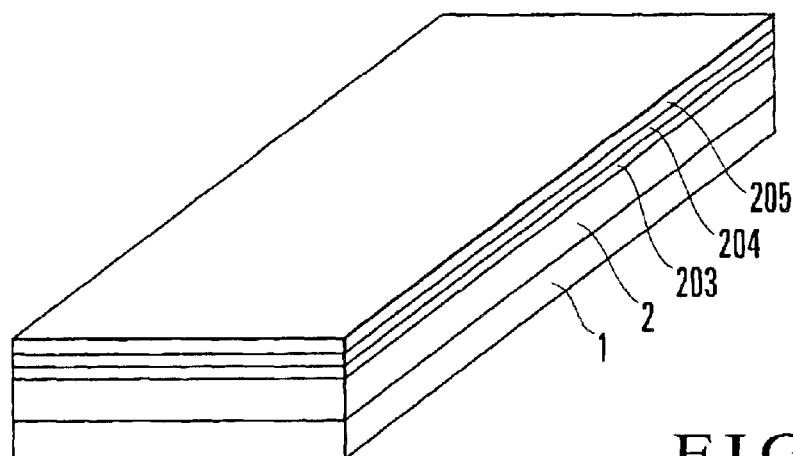
FIGS. 4A to 4G are views showing the steps in a manufacturing method according to the third embodiment of the present invention.

First of all, as shown in FIG. 4A, the 0.2 μm-thick Se-doped n-InP cladding layer 2, the 40 nm-thick undoped InGaAsP guide layer 203 having a bandgap wavelength of 1.3 μm, the 0.15 μm-thick strained undoped InGaAsP/InGaAsP MQW (multiple quantum well) active layer 204 having a lasing wavelength of 1.55 μm, and the 40 nm-thick undoped InGaAsP guide layer 205 having a bandgap wavelength of 1.3 μm were successively grown on the (100) oriented n-InP substrate 1 by the MOVPE method.

Figure 4B:
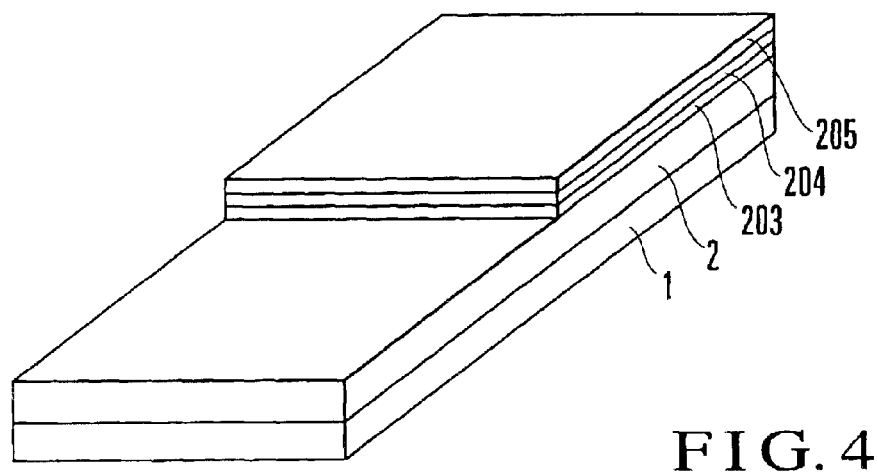

As shown in FIG. 4B, the above multilayer structure (the 40 nm-thick undoped InGaAsP guide layer 203 having a bandgap wavelength of 1.3 μm, the 0.15 μm-thick strained undoped InGaAsP/InGaAsP MQW (multiple quantum well) active layer 204 having a lasing wavelength of 1.55 μm, and the 40 nm-thick undoped InGaAsP guide layer 205 having a bandgap wavelength of 1.3 μm) in the region where an electroabsorption optical modulator (EAM) is to be manufactured is removed by etching.

Figure 4C:
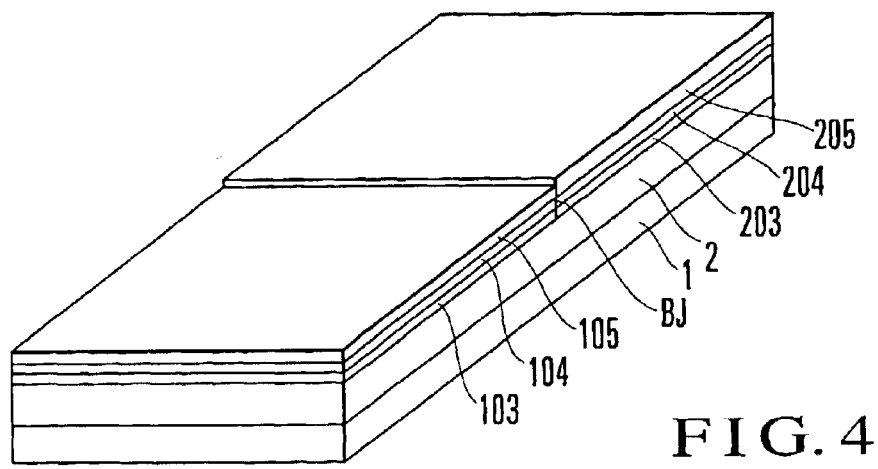

As shown in FIG. 4C, in the region where an electroabsorption optical modulator (EAM) is to be manufactured, the 40 nm-thick undoped InGaAsP guide layer 103 having a bandgap wavelength of 1.3 μm, the 0.15 μm-thick strained undoped InGaAsP/InGaAsP MQW (multiple quantum well) active layer 104 having a lasing wavelength of 1.50 μm, and the 40 nm-thick undoped InGaAsP guide layer 105 having a bandgap wavelength of 1.3 μm are grown by the MOVPE method.

The photoabsorption layer 104 of the electroabsorption optical modulator (EAM) is optically coupled to the active layer 204 of the distributed feedback laser (DFB-LD) by butt-joint (BJ) configuration.

Figure 4D:
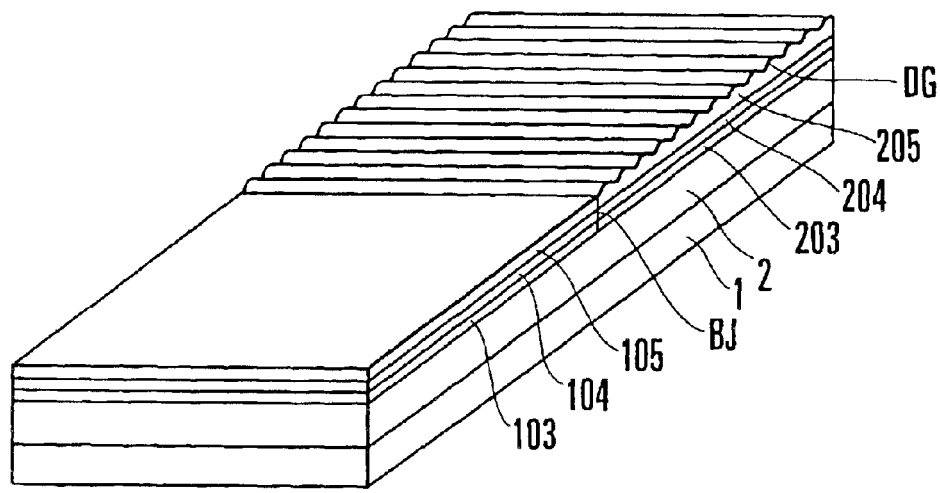

As shown in FIG. 4D, a diffraction grating DG is formed on the surface of the InGaAsP guide layer 20 in the region where a distributed feedback laser (DFB-LD) is to be manufactured.

Figure 4E:
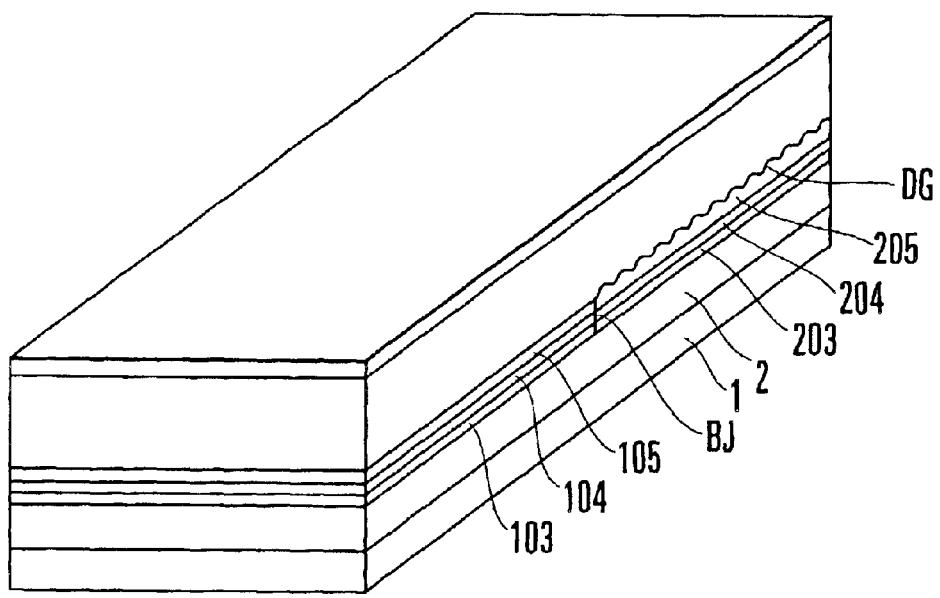

As shown in FIG. 4E, the 1.5 μm-thick Zn-doped p-InP cladding layer 6 and 0.3 μm-thick Zn-doped InGaAs contact layer 7 are grown on the entire surface of the resultant structure by the MOVPE method.

Figure 4F:
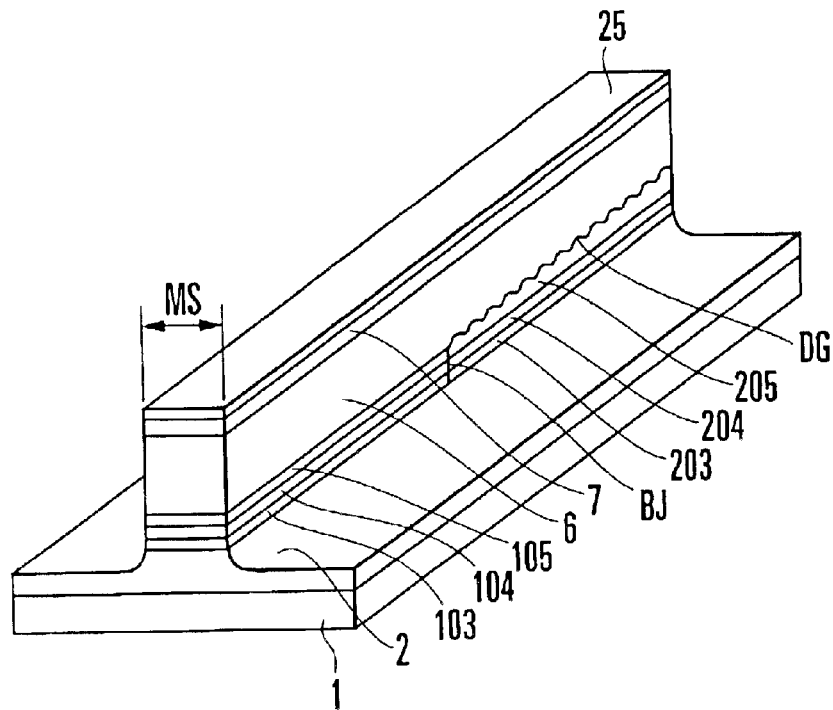

As shown in FIG. 4F, a mesa stripe having a width of about 2 μm and a height of about 3 μm is formed by RIE (reactive ion etching) using an $SiO_2$ film as a mask 25. Both the electroabsorption optical modulator portion (EAM) and the distributed feedback laser portion (DFB-LD) have the same mesa stripe MS structure.

Figure 4G:
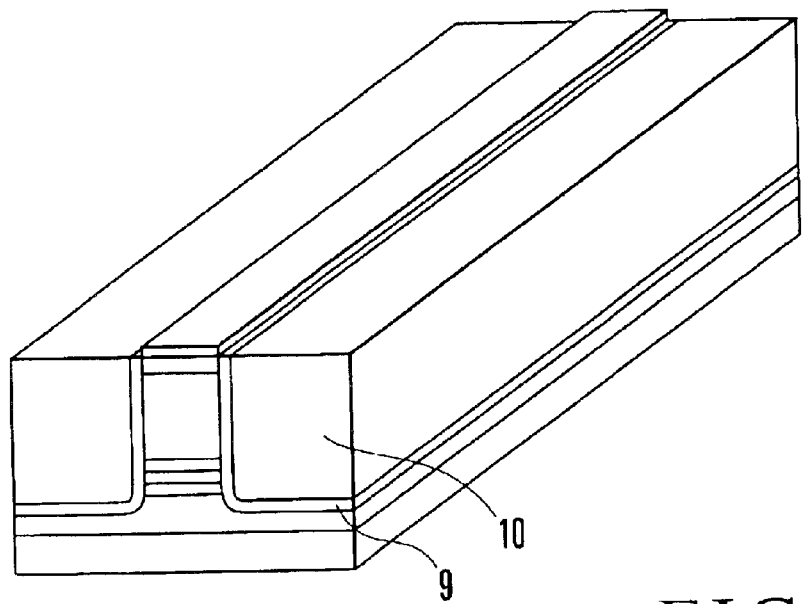
Figure 5:
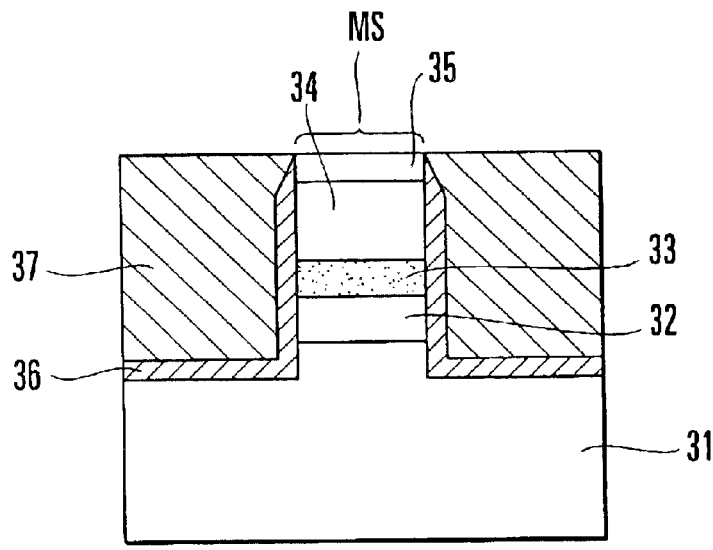
FIG. 5 is a view for explaining the prior art.
Figure 6:
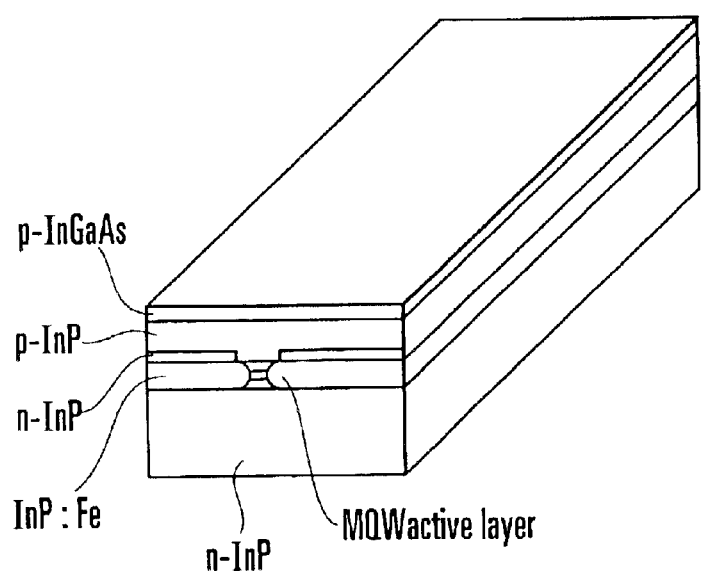
FIG. 6 is a view for explaining the prior art.

Finally, as shown in FIG. 4G, on the substrate on which the mesa stripe MS was formed, the Fe-doped InP layer 9 using as a diffusion enhancement layer was grown adjacent to the mesa stripe MS, and the Ru-doped InP layer 10 (thickness: 3 μm) using as a diffusion suppression layer was grown adjacent to the InP layer 9 by the MOVPE method. The Fe-doped InP layer 9 was grown by using a known source material.

In addition, bis(η 5-2, 4-dimethylpentadienyl)ruthenium (II) was used as an Ru source.

Subsequently, the $SiO_2$ mask was removed, and the $SiO_2$ passivation film 11 was formed on the entire surface of the resultant structure except for a surface portion immediately above the mesa stripe MS. The p-electrode 12 was then formed, and the n-electrode 13 was formed on the lower surface of the substrate 1, thereby completing the device shown in FIG. 3.

This embodiment has exemplified the integrated light source in which an active layer of a semiconductor laser and a photoabsorption layer of an optical modulator are coupled by using a butt-joint configuration. However, the present invention is not limited to this. Identical multiple quantum well (MQW) layers each having an active layer and photoabsorption layer grown together may be used, in which the bandgap energy of the active layers is small, and the bandgap energy of the photoabsorption layers is large. In this case, a known selective area growth method may be used to form the active layers and photoabsorption layers (Japanese Patent Laid-Open No. 1–321677).

More specifically, mask-stripe-like $SiO_2$ masks are placed on only two sides of a region where an active layer is to be grown, and a multiple quantum well structure is grown by the metalorganic vapor phase epitaxy method. In the region sandwiched between the mask stripes, the well layer becomes thick. The bandgap energy of this region is therefore smaller than that of the remaining regions.

In the above embodiment, an InP crystal is used for the buried layers 9 and 10. Obviously, however, a material lattice-matched to InP, e.g., InGaAlAs, InAlAs, or InGaAsP can also be effectively used. In addition, InGaAsP, InGaAlAs, InAlAs MQW layers are used for multiple quantum well layers. Obviously, however, the present invention can also be effectively applied to structures such as bulk and multiple quantum well layers in all systems using InP substrates, including an InP-InGaAsP-InGaAs system, InAlAs system, InGaAlAs system, and InGaAs system.

Although Zn is exemplified as a p-impurity, the same effects as those described above can also be obtained by using a p-impurity other than Zn, e.g., Be, Cd, or Mg. In addition, Se is exemplified as an n-impurity, but the present invention can also obtain the same effects as those described above by using other additives having the same conductivity types as those described above.

In this embodiment, the semiconductor lasers and optical modulators have been described. Obviously, however, the present invention can also be effectively applied to other semiconductor devices such as semiconductor amplifiers and photodiodes, single devices, and integrated devices such as an optical modulator integrated semiconductor laser and a semiconductor amplifier/light modulator integrated device.

As has been described above, the present invention realizes a high-performance buried semiconductor device and is characterized in that a semi-insulating semiconductor crystal used for burying includes two layers, i.e., a layer that enhances impurity diffusion and a layer that suppresses impurity diffusion. This makes it possible to reduce leakage current in the buried interface and suppress an increase in device capacitance.

As has been described on the basis of the embodiments, the present invention is characterized in that the semi-insulating semiconductor crystal in which the mesa stripe is buried is constituted by the diffusion enhancement layer containing a semi-insulating impurity that enhances diffusion of a p-impurity and a semi-insulating layer containing a semi-insulating impurity that suppresses diffusion of the p-impurity, the diffusion enhancement layer is inserted between a side wall of the mesa stripe and the semi-insulating layer, and the diffusion enhancement layer is doped with a semi-insulating impurity that enhances interdiffusion with a p-type impurity.

In addition, the semi-insulating layer outside the diffusion enhancement layer contains a semi-insulating impurity that suppresses diffusion of a p-impurity.

For this reason, diffusion of a p-impurity is limited by the interface between the diffusion enhancement layer and the semi-insulating layer.

Since the diffusion enhancement layer is doped with a semi-insulating impurity that enhances diffusion of a p-impurity, a p-impurity is diffused from the p-cladding layer, which is in contact with the diffusion enhancement layer, in a burying growth process. As a consequence the conductivity type of the diffusion enhancement layer changes to the p type. This decreases defects in the interface between the p-cladding layer and the diffusion enhancement layer and reduces leakage current.

Since the semi-insulating layer is doped with a semi-insulating impurity that suppresses diffusion of a p-impurity, the p-impurity is not easily diffused into the semi-insulating layer. This limits diffusion of a p-impurity up to the diffusion enhancement layer.

For the above reasons, the use of the present invention will produce the noticeable effect of providing a semiconductor device having a structure that can control diffusion of a p-impurity into a semi-insulating buried layer and a method of manufacturing the device.

In addition, when an integrated device is to be formed by using a semiconductor laser (LD) and an EA modulator (electroabsorption modulator), the semiconductor laser and EA modulator often have the same waveguide structure and buried structure. In such a case, in the semiconductor laser portion, in order to reduce leakage current, it is necessary to decrease defects in the regrowth interface by enhancing Zn diffusion from the mesa stripe. In the EA modulator, however, if the device capacitance increases due to Zn diffusion, high speed modulation cannot be done. It is therefore necessary to properly control the spread of Zn diffusion. According to the present invention, by controlling the impurity doping concentration of the diffusion enhancement layer, a device that meets characteristic requirements for a semiconductor laser and EA modulator can be manufactured.

What is claimed is:

1. A semiconductor optical device characterized by comprising, on a semiconductor substrate, a mesa-stripe-like multilayer structure constituted by at least an n-cladding layer, an active region formed from an active layer or a photoabsorption layer, and a p-cladding layer, and a buried layer in which two sides of said multilayer structured are buried using a semi-insulating semiconductor crystal, said buried layer including a diffusion enhancement layer which is adjacent to said mesa-stripe-like multilayer structure and enhances diffusion of a p-impurity, and a diffusion suppression layer which is adjacent to the diffusion enhancement layer and suppresses diffusion of a p-impurity up to said diffusion enhancement layer.

2. A device according to claim 1, wherein the semiconductor substrate is made of (100) oriented InP.

3. A device according to claim 1, wherein the diffusion enhancement layer that enhances diffusion of the p-impurity is made of semiconductor crystal doped with iron, and the diffusion suppression layer that suppresses diffusion of the p-impurity is made of semiconductor crystal doped with ruthenium.

4. A device according to claim 1, wherein the semiconductor substrate is made of InP, the diffusion enhancement layer that enhances diffusion of the p-impurity is made of InP doped with iron, and the diffusion suppression layer that suppresses diffusion of the p-impurity is made of InP doped with ruthenium.

5. A device according to claim 3, wherein
the semiconductor substrate is made of InP, and
the diffusion enhancement layer that enhances diffusion of the p-impurity is made of a material selected from the group consisting of iron-doped InAlAs, iron-doped InGaAlAs, iron-doped InGaAs, and iron-doped InGaAsP.

6. A device according to claim 3, wherein
the semiconductor substrate is made of InP, and
the diffusion suppression layer that suppresses diffusion of the p-impurity is made of a material selected from the group consisting of ruthenium-doped InAlAs, ruthenium-doped InGaAlAs, ruthenium-doped InGaAs, and ruthenium-doped InGaAsP.

7. A semiconductor optical device characterized by comprising:
a semiconductor laser (DFB-LD) including, on a semiconductor substrate, a mesa-stripe-like multilayer structure constituted by at least an n-cladding layer, an active region formed from an active layer, and a p-cladding layer, and a buried layer in which two sides of said multilayer structured are buried using a semi-insulating semiconductor crystal,
said buried layer including
a diffusion enhancement layer which is adjacent to said mesa-stripe-like multilayer structure and enhances diffusion of a p-impurity, and
a diffusion suppression layer which is adjacent to the diffusion enhancement layer and suppresses diffusion of a p-impurity up to said diffusion enhancement layer; and
an electroabsorption optical modulator (EAM) including, on a semiconductor substrate, a mesa-stripe-like multilayer structure constituted by at least an n-cladding layer, an active region formed from a photoabsorption layer, and a p-cladding layer, and a buried layer in which two sides of said multilayer structured are buried using a semi-insulating semiconductor crystal,
said buried layer including
a diffusion enhancement layer which is adjacent to said mesa-stripe-like multilayer structure and enhances diffusion of a p-impurity, and
a diffusion suppression layer which is adjacent to the diffusion enhancement layer and suppresses diffusion of a p-impurity,
wherein a monolithically integrated light source including said semiconductor laser (DFB-LD) and said electroabsorption optical modulator (EAM) is formed.

8. A semiconductor optical device characterized by comprising, on a semiconductor substrate made of InP, a mesa-stripe-like multilayer structure constituted by at least an n-cladding layer, an active region formed from an active layer or a photoabsorption layer, and a p-cladding layer, and a buried layer in which two sides of said multilayer structured are buried using a semi-insulating semiconductor crystal,
said buried layer including
a diffusion enhancement layer which is adjacent to said mesa-stripe-like multilayer structure and enhances diffusion of a p-impurity is made of a material selected from the group consisting of iron-doped InAlAs, iron-doped InGaAlAs, iron-doped InGaAs, and iron-doped InGaAsP, and
a diffusion suppression layer which is adjacent to the diffusion enhancement layer and suppresses diffusion of a p-impurity.

9. A semiconductor optical device characterized by comprising, on a semiconductor substrate made of InP, a mesa-stripe-like multilayer structure constituted by at least an n-cladding layer, an active region formed from an active layer or a photoabsorption layer, and a p-cladding layer, and a buried layer in which two sides of said multilayer structured are buried using a semi-insulating semiconductor crystal,
said buried layer including
a diffusion enhancement layer which is adjacent to said mesa-stripe-like multilayer structure and enhances diffusion of a p-impurity, and
a diffusion suppression layer which is adjacent to the diffusion enhancement layer and suppresses diffusion of a p-impurity is made of a material selected from the group consisting of ruthenium-doped InAlAs, ruthenium-doped InGaAlAs, ruthenium-doped InGaAs, and ruthenium-doped InGaAsP.

* * * * *